(12) United States Patent
Liu et al.

(10) Patent No.: US 10,763,280 B2
(45) Date of Patent: Sep. 1, 2020

(54) HYBRID FINFET STRUCTURE

(71) Applicant: Taiwan Semiconductor Manufacturing Co., Ltd., Hsin-Chu (TW)

(72) Inventors: Chien-Chen Liu, New Taipei (TW); Guan-Jie Shen, Hsinchu (TW); Chia-Der Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/990,278

(22) Filed: May 25, 2018

(65) Prior Publication Data

US 2019/0006392 A1    Jan. 3, 2019

Related U.S. Application Data

(60) Provisional application No. 62/513,012, filed on May 31, 2017.

(51) Int. Cl.

| H01L 27/12 | (2006.01) |
| H01L 29/08 | (2006.01) |
| H01L 21/308 | (2006.01) |
| H01L 21/8234 | (2006.01) |
| H01L 29/78 | (2006.01) |
| H01L 27/088 | (2006.01) |
| H01L 21/8238 | (2006.01) |
| H01L 27/092 | (2006.01) |

(52) U.S. Cl.
CPC ........ H01L 27/1211 (2013.01); H01L 21/308 (2013.01); H01L 21/823431 (2013.01); H01L 21/823821 (2013.01); H01L 27/0886 (2013.01); H01L 27/0924 (2013.01); H01L 29/0847 (2013.01); H01L 29/785 (2013.01); H01L 21/3086 (2013.01)

(58) Field of Classification Search
CPC . H01L 27/1211; H01L 29/785; H01L 29/0847
See application file for complete search history.

(56) References Cited

U.S. PATENT DOCUMENTS

| 2015/0270342 | A1* | 9/2015 | Tsai | H01L 29/0847 |
| | | | | 257/43 |
| 2016/0043170 | A1* | 2/2016 | Park | H01L 27/0886 |
| | | | | 257/369 |
| 2016/0093537 | A1* | 3/2016 | Chen | H01L 21/823431 |
| | | | | 438/283 |
| 2016/0315146 | A1* | 10/2016 | Jung | H01L 29/0847 |
| 2017/0338229 | A1* | 11/2017 | Oh | H01L 21/823821 |
| 2017/0352541 | A1* | 12/2017 | Hsu | H01L 21/02636 |

* cited by examiner

Primary Examiner — Julia Slutsker
(74) Attorney, Agent, or Firm — Duane Morris LLP

(57) ABSTRACT

A semiconductor device includes a first fin field effect transistor (FinFET) device, the first FinFET device including a plurality of fins formed in a substrate, an epitaxial layer of semiconductor material formed on the fins forming non-planar source/drain regions, and a first gate structure traversing across the plurality of fins. The semiconductor device includes a second FinFET device, the second FinFET device including a substantially planar fin formed in the substrate, an epitaxial layer of the semiconductor material formed on the substantially planar fin and forming substantially planar source/drain regions, and a second gate structure traversing across the substantially planar fin.

19 Claims, 14 Drawing Sheets

HYBRID FINFET STRUCTURE

CROSS-REFERENCE TO RELATED APPLICATION

This application is a non-provisional of and claims priority to U.S. provisional patent application No. 62/513,012 filed May 31, 2017, the entirety of which is hereby incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are manufactured on a single semiconductor wafer, and individual dies on the wafer are singulated by sawing between the integrated circuits along a scribe line. The individual dies are typically packaged separately, in multi-chip modules, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have generally been adequate for their intended purpose, they have not been entirely satisfactory in all aspects.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

This application relates to a semiconductor device and its manufacturing method, and more particularly to a semiconductor device having fin field effect transistors (FinFETs) and a manufacturing method thereof. In embodiments, the FinFET structure can be optimized in specific regions for different electrical requirements, for example to provide transistor device structures optimized for electrostatic discharge (ESD) protection, high voltage metal-oxide-semiconductor devices (HVMOS), gated diodes, or other structures. Conventional FinFET structures maintain the original FinFET structure patterning across all active device regions, including in areas of larger spacing between adjacent polysilicon gates. This approach can lead to failures in metal contact landing and lower linear-region drain current (Idlin) due to lower epitaxial film growth performance that produces higher junction resistance (e.g., higher Rsd). In certain embodiments described herein, a device structure includes a first active area (typically known as an oxide definition (OD) area) for non-planar FinFET device or devices and a second active area for planar FinFET device or devices. Silicon epitaxial growth film quality is improved in the second active region for planar FinFET devices, which allows for improved device performance, particularly in Idlin performance due to reduced Rsd resistance. The landing window for metal contact landing is increased, which improves yield and reliability performance.

Figure 1:
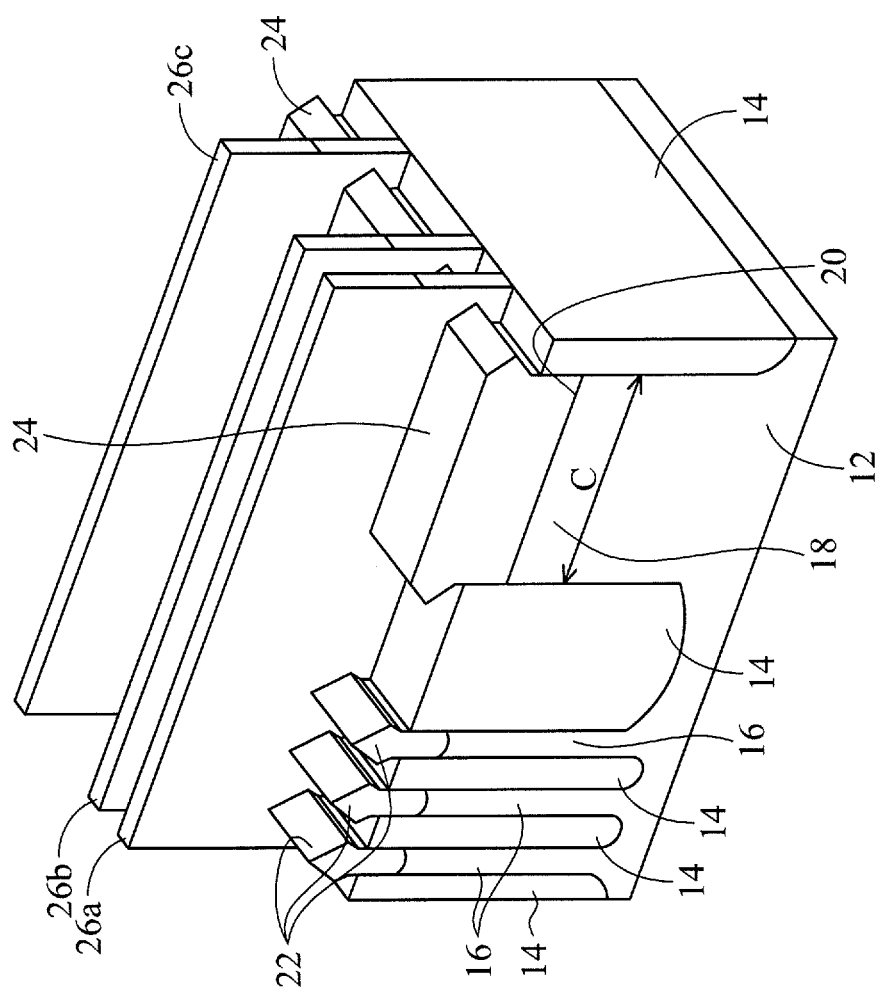
FIG. 1 illustrates a perspective view of a semiconductor device having a hybrid FinFET device structure, according to certain embodiments.

FIG. 1 is a perspective view of a semiconductor device 10 having two different kinds of active areas, also referred to herein as oxide definition (OD) areas or patterns. Each active area is a doped area and includes a source region and a drain region, and a channel region between the source region and drain region. Examples of materials of the active area include, but are not limited to, semiconductor materials doped with various types of p-dopants and/or n-dopants. More specifically, the semiconductor device 10 includes a silicon substrate 12 having areas separated by oxide isolation regions 14. In a first active area (OD area), closely spaced source/drain regions 22 are formed over silicon regions 16, which are also referred to as fins 16. In embodiments, the source/drain regions 22 are regions of epitaxially grown material formed on corresponding silicon regions 16. In embodiments the epitaxial grown material includes a SiP (silicon phosphorous) layer. In some embodiments, the epitaxial grown material includes SiGe (silicon germanium) layer. Three spaced gate structures 26a, 26b and 26c, which may be formed of polysilicon or at least one metal material, are shown extending perpendicular to the source/drain regions 22. In a second active area (OD area), a silicon region 18 has a relatively wide (when compared to regions 16) area having a planar boundary 20 on which epitaxial source/drain region 24 is formed. Region 18 can be considered as a Si platform region when compared to fins 16. In embodiments, the source/drain regions 24 are also formed from epitallixally grown silicon, SiP, and/or SiGe.

Figure 2:
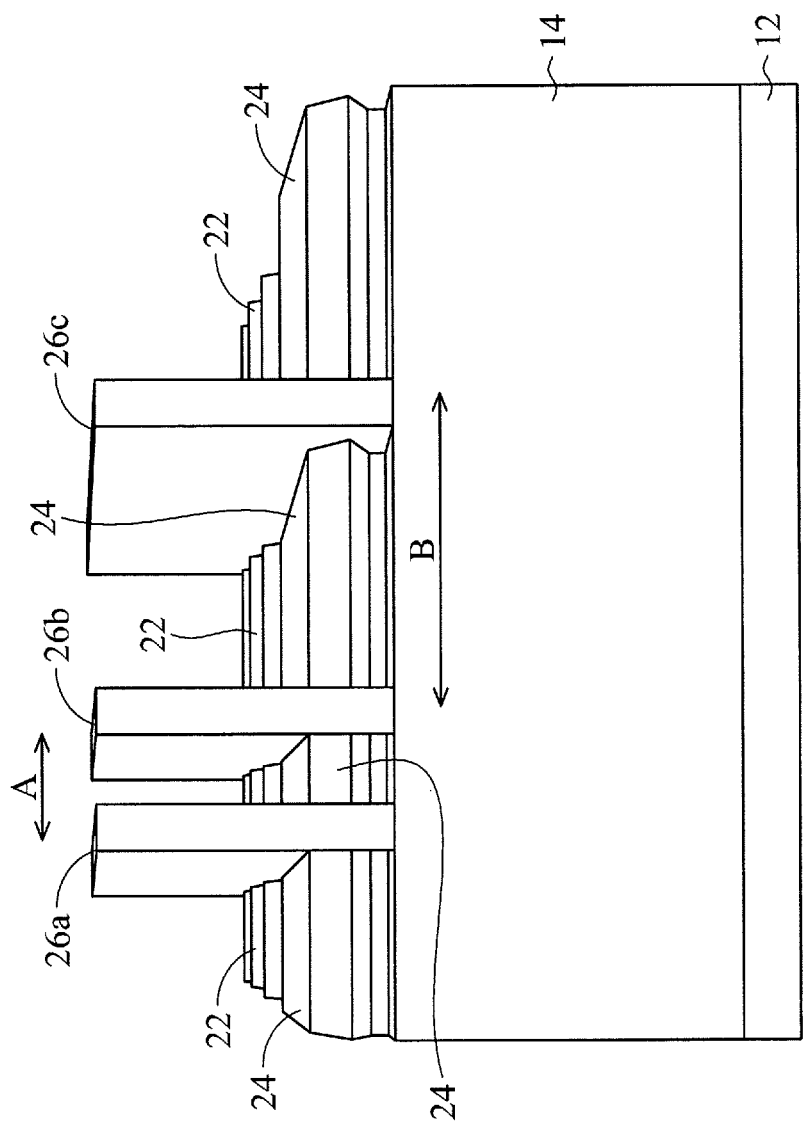
FIG. 2 illustrates a side perspective view of the semiconductor device of FIG. 1, according to certain embodiments.
Figure 3:
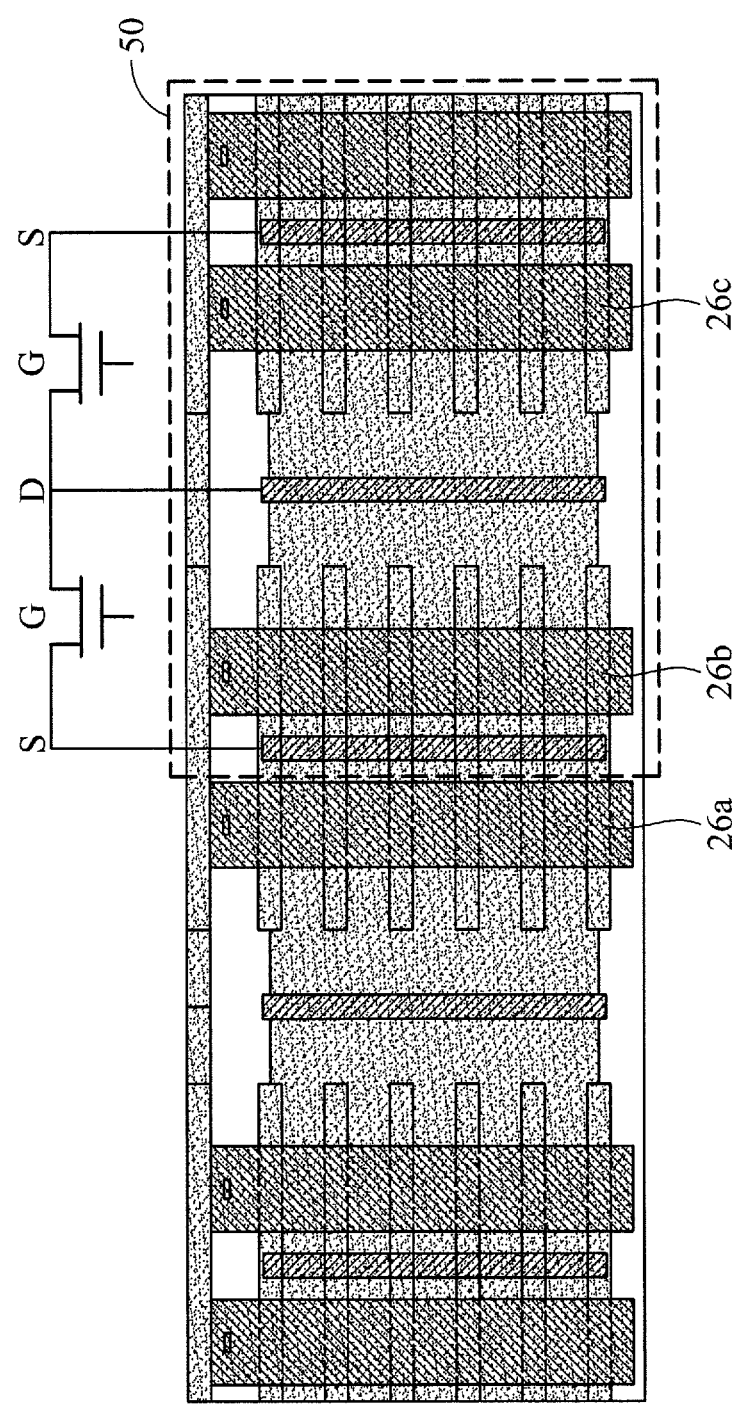
FIG. 3 illustrates a device layout of the semiconductor device of FIG. 1, according to certain embodiments.

FIG. 2 shows a side perspective view of the semiconductor device 10 of FIG. 1. In this view, the spacing of the three gate structures 26a, 26b and 26c is shown more clearly. It can be seen that gate structures 26a and 26b are spaced apart by a relatively shorter distance when compared to the distance separating apart the gate structures 26b and 26c. For example, gate structures 26a and 26b are spaced (on center) a distance A that in embodiments is about 0.1 to about 0.3 µm apart; and gate structures 26b and 26c are spaced further apart from one another (on center) a distance B that in embodiments is about 0.4 to about 0.5 µm apart. It should be understood that as shown in the device layout of FIG. 3, the two spaced gate structures 26b and 26c (which are shown as two spaced lines) form two gates of a two transistor arrangement. Specifically, FIG. 3 shows an arrangement of two NMOS transistors formed in a P-well 50, though it should be understood that the teachings herein apply equally to an arrangement of PMOS transistors or to a CMOS arrangement. With respect to FIGS. 2 and 3, a first transistor arrangement is formed by the three source/drain regions 22 to the left of gate structure 26b, the three source/drain regions to the right of gate structure 26b and left of the gate structure 26c, and the three SiP source 22 to the right of polysilicon gate 26c. A second transistor arrangement is formed by the SiP source region/fin 24 to the left of polysilicon gate 26b, the SiP drain region/fin 24 to the right of the polysilicon gate 26b and left of the polysilicon gate 26c, and the SiP source region/fin 24 to the right of the polysilicon gate 26c. It should be understood that while the polysilicon gates 26b and 26c are shown as continuous gate line shared between the first and second transistor arrangements in the different active areas, this is for ease of illustration only. The polysilicon lines can be cut to allow for individual control of the first and second transistor arrangements, i.e., to form separated gate structures.

It should be understood that the wider distance B, between the gate structures 26b and 26c, is provided in order to provide stronger protection against ESD in the transistor arrangements. For example, such a wider distance allows a wider source/drain region to be formed therein, which can lower Rsd of such a source/drain region. Accordingly, Idlin can be significantly increased under a same applied voltage, thereby making the corresponding transistor to have stronger protection against ESD. Further, this area, also referred to as a dishing area, is an area for contact landing for connecting the transistor, specifically the source/drain region, to a metal interconnection layer (e.g., an M1 layer). It should be understood that area between more narrowly spaced polysilicon lines (spacing A) is used for contact landing for connecting the transistor, specifically the source region, to the M1 layer.

It has been found that by not repeating the arrangement source/drain region 22 from the first configuration of the first active area in the second active area, and rather forming the source/drain region 24 over a wider and more planar surface 20 (shown in FIG. 1), a richer and better epitaxial film growth can be achieved, particularly in the wider areas of spacing between the gate structures 26b, 26c (i.e., in the dishing region). The upper surface of the source/drain region 24 is wider and more planar than the non-planar, mushroom cap-shaped source/drain region 22 and provides a better contact window for metal contact landing. It is understood that a source/drain region cannot be perfectly planar and as such the term "substantially planar" is sometimes used herein. That is, the source/drain region is sufficiently planar (i.e., substantially planar) such that it results in larger linear-region drain current (Idlin) due to lower resistance from the larger source/drain region, as compared to keeping the standard FinFET patterning (non-planar source/drain region 22 patterning) in the second active area.

This approach described herein, where a planar FinFET transistor is formed in an OD region alongside of a more standard FinFET OD region, allows for better optimization of the transistor structure in selected regions. For example, the second arrangement, i.e., the planar arrangement, may be used to form transistors having different electrical requirements, such as transistors used in ESD protection devices, HVMOS devices or gated diodes.

In embodiments, the width (C) of the planar OD region 18 is at least 100 nm across (i.e. in the direction parallel to the polysilicon gates 26), and in some embodiments is at least 200 nm. It has been found that this size is critical to providing for rich epitaxial growth for source/drain region 24. This results in the source/drain regions 22 each having a generally mushroom cap shape. In embodiments, the width C of the planar OD region is around 150 to about 250 nm and in that region a relatively uniformly thick source/drain region 24 having a thickness of at least 61 nm was observed. In comparison, in the same corresponding region in the FinFET (non-planar) first OD region, a relatively poorer epitaxial film growth was observed having a thickness of around 24 nm or less. This represents an increased amount of around 250% in the epitaxial film growth in the planar OD region as compared to the non-planar FinFET region.

Figure 4:
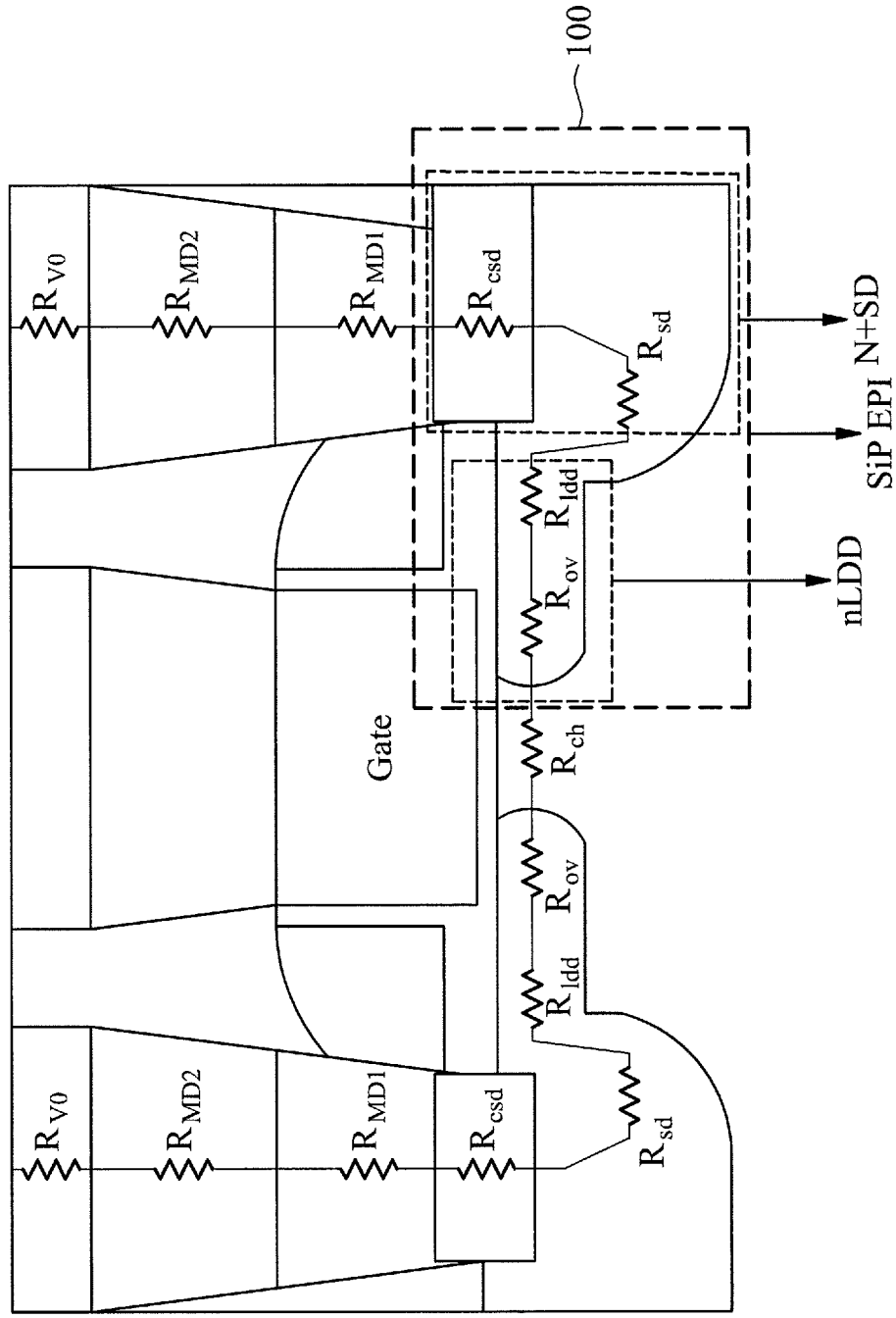
FIG. 4 illustrates a schematized cross-sectional view of a transistor illustrating various components that contribute to the resistances in the transistor connections

FIG. 4 is a schematized cross-sectional view of a transistor illustrating various resistances that contribute to the overall resistance in the transistor connections. Resistance $R_{V0}$ represents the resistance attributable to the connection between the metal and the MD Contact layer. Resistance $R_{MD2}$ represents the resistances attributable to the MD contact layer due to the second MD process, and resistance $R_{MD1}$ represents the resistances attributable to the MD contact layer due to the first MD process. Resistance $R_{csd}$ represents the resistance attributable to the contact to the source/drain implant layer. Resistance $R_{sd}$ represents the resistance attributable to the source/drain implant. $R_{ldd}$ represents the resistance attributable to the lightly doped drain (LDD) implant dosage. Resistance $R_{OV}$ represents the resistance of the overlap from the electric capacity process, which is the accumulation layer under the gate overlay, i.e., a region of the resist without channel and LDD implant due to shadow effect. Finally, resistance $R_{ch}$ represents the resistance of the electrical channel. The reference nLDD in FIG. 4 illustrates that the NMOS LDD implant dosage process will reduce the resistance of $R_{ldd}$ and $R_{OV}$ dependent upon the implant dosage. The reference N+SD illustrates that the source/drain implant process will have an effect on the resistances of $R_{sd}$ and $R_{csd}$.

The resistances contained in region 100 are dependent on the epitaxial layer, such as SiP and/or SiGe. Resistance $R_{OV}$ is affected by the first stage of epitaxially growth. The quality of the epitaxial layer in this stage affects the amount of bottom leakage. The resistance $R_{ldd}$ is also affected by the first stage of SiP growth and the dopant concentration in the LDD region. Resistance $R_{sd}$ is affected by the second stage of SiP growth and the dopant concentration in the SiP layer. Finally, the resistance $R_{csd}$ is affected by the third stage of SiP growth, including the amount of the SiP consumed by the silicide (e.g., TiSi) contacts to the SiP layer. In short, a larger and better quality SiP layer, which is achievable in the planar OD region, can significantly lower $R_{sd}$ by improving electrical conduction between the MD contact landing and the SiP region, which is a major contributor to the overall resistance.

In some embodiments, the device structure of FIG. 1 was fabricated to have about 1.8V operation voltage in both a non-planar OD region (standard FinFET) and planar (planar FinFET) OD region. Rich epitaxial SiP growth was observed for the transistors in the planar OD region, which resulted in good MD contact landing. The device structure was tested and a 76% gain in Idlin performance was observed.

Figure 5A:
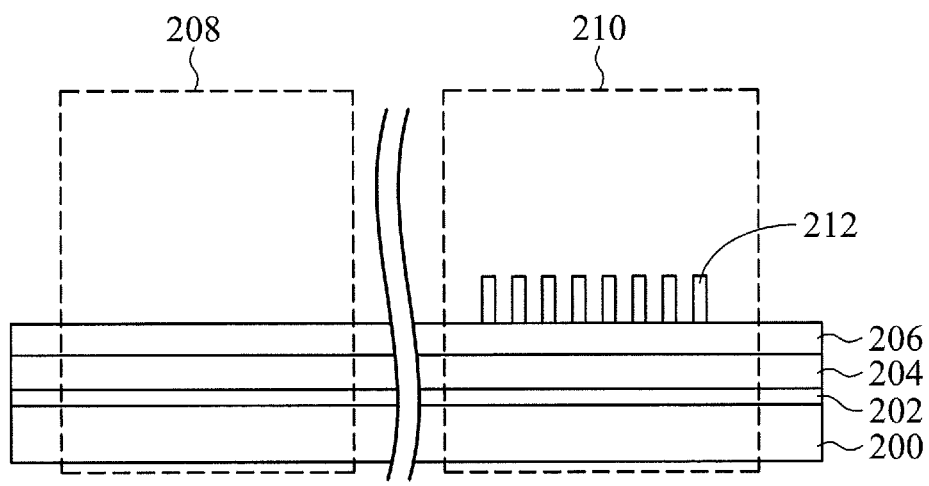
FIGS. 5A to 5N illustrate a method of forming a hybrid OD area in a substrate, according to certain embodiments.
Figure 5B:
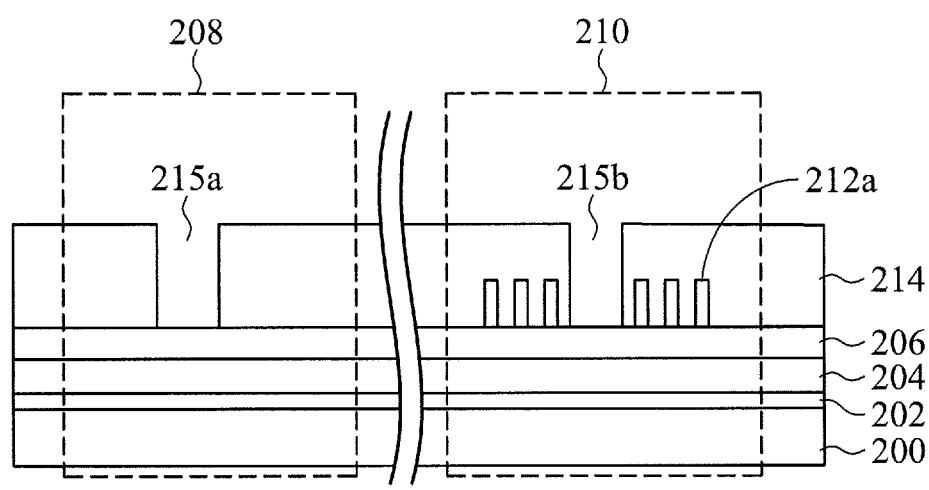
Figure 5C:
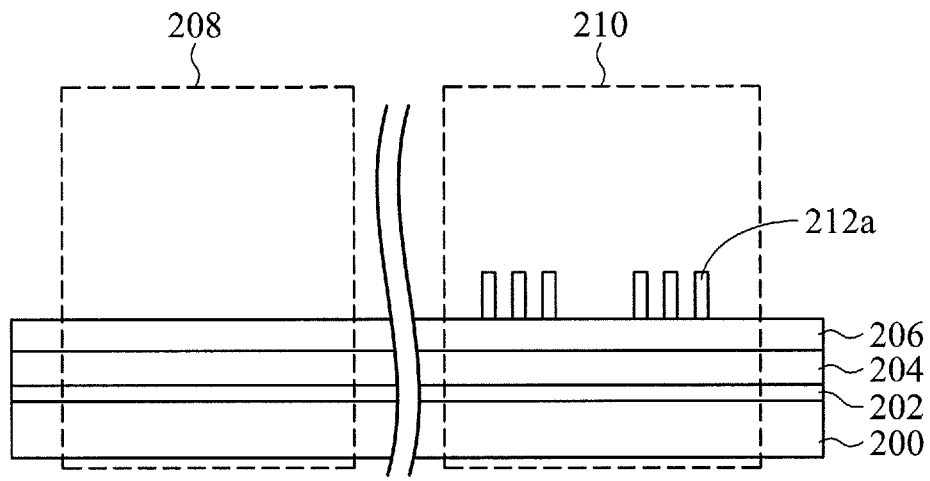
Figure 5D:
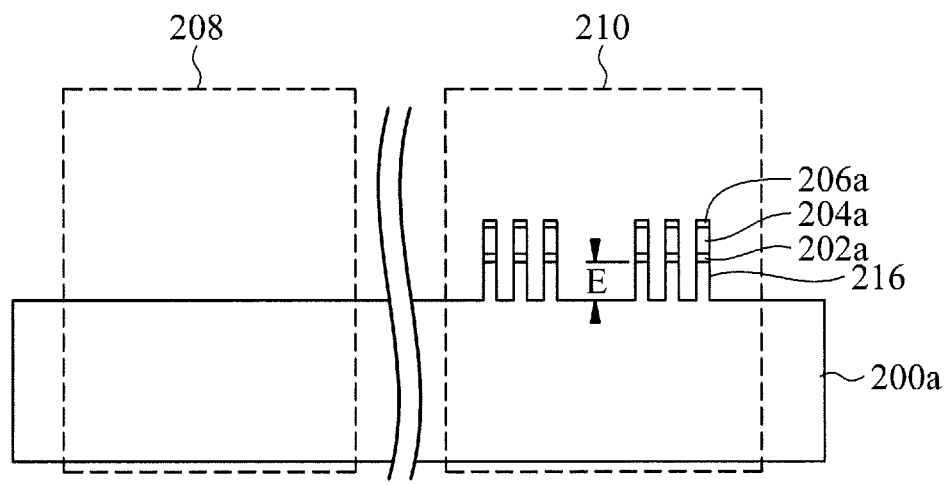
Figure 5E:
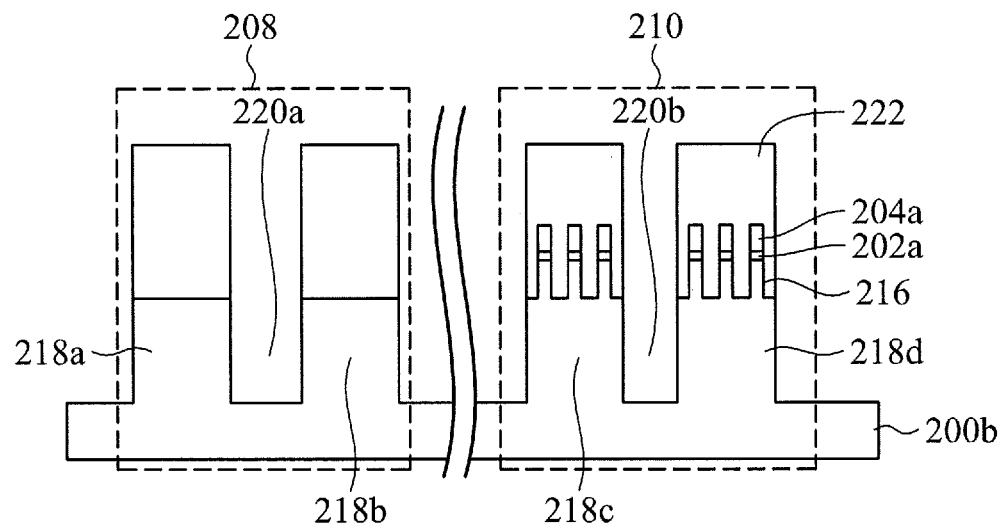
Figure 5F:
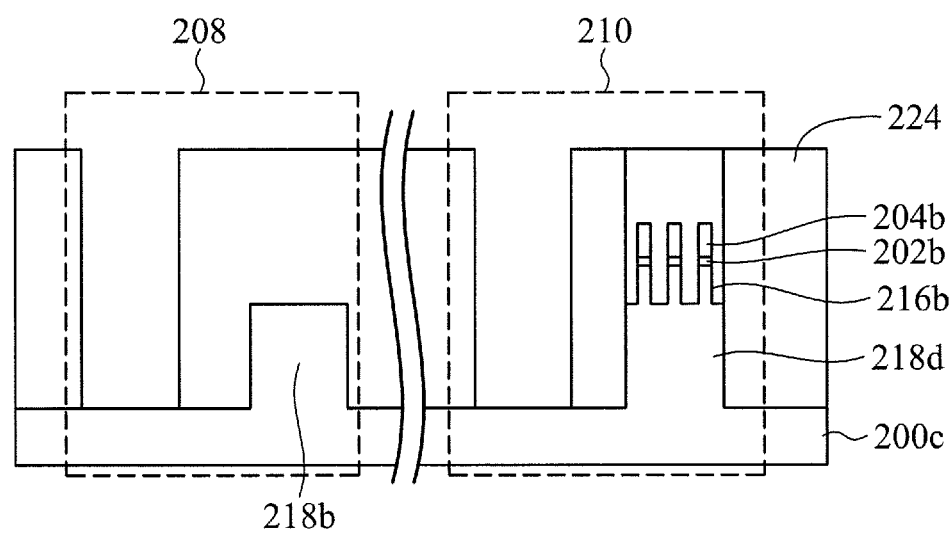
Figure 5G:
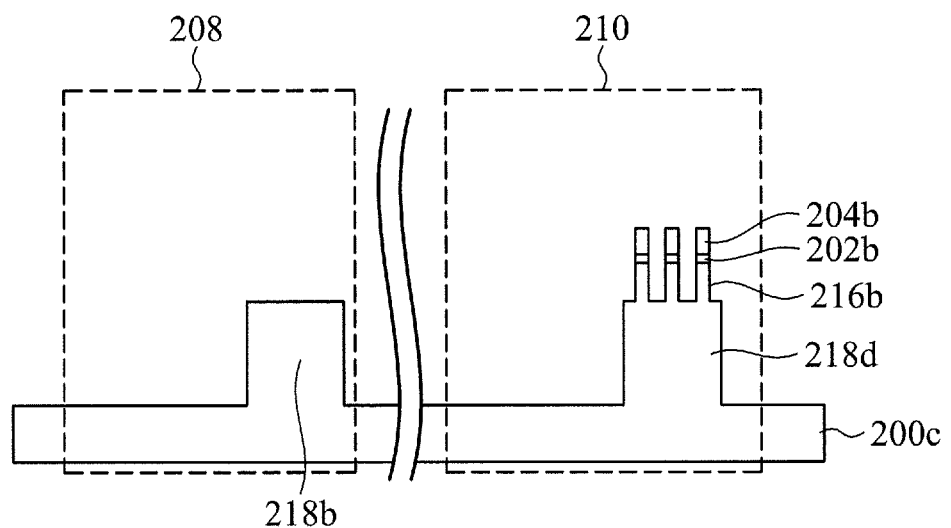
Figure 5H:
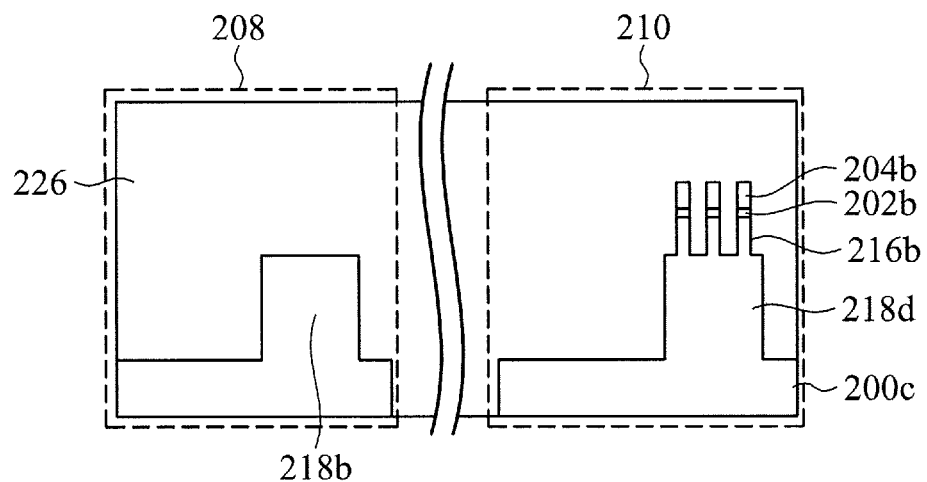
Figure 5I:
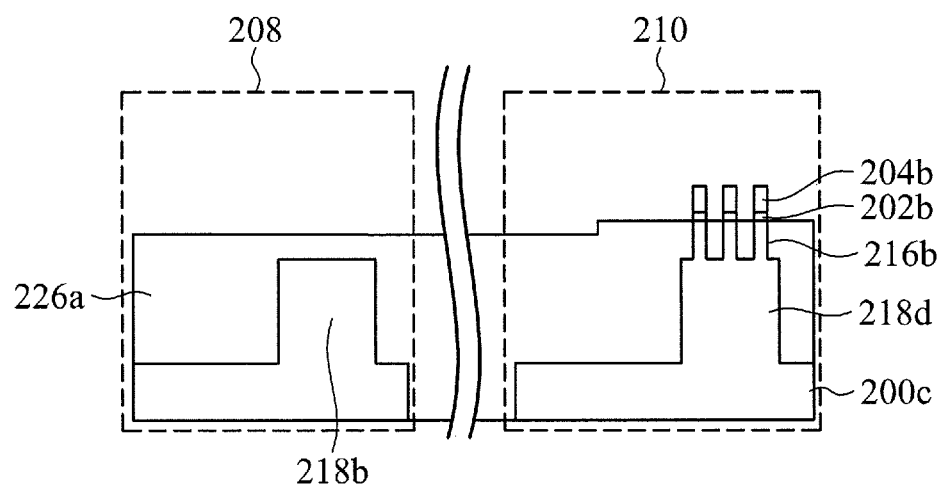
Figure 5J:
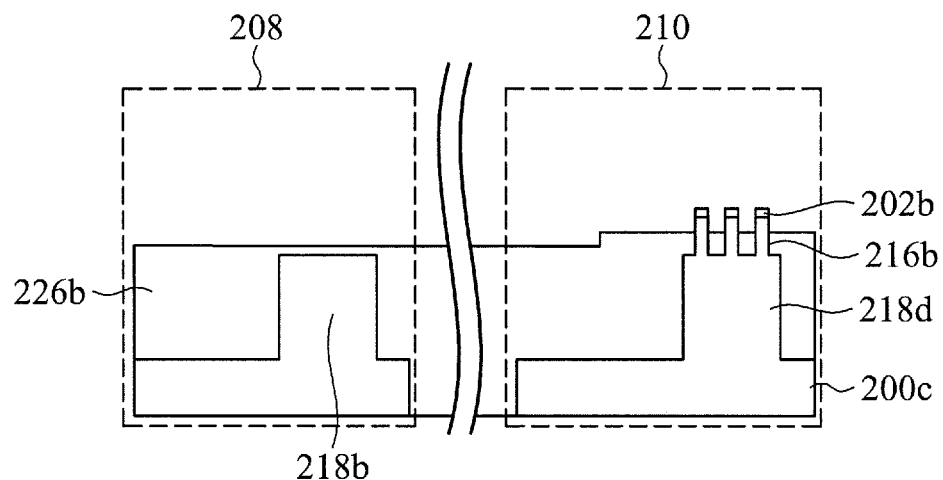
Figure 5K:
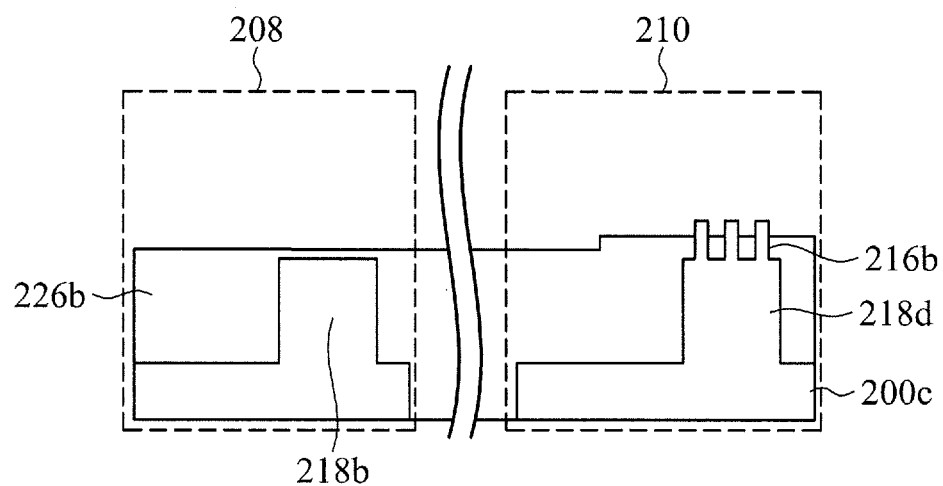
Figure 5L:
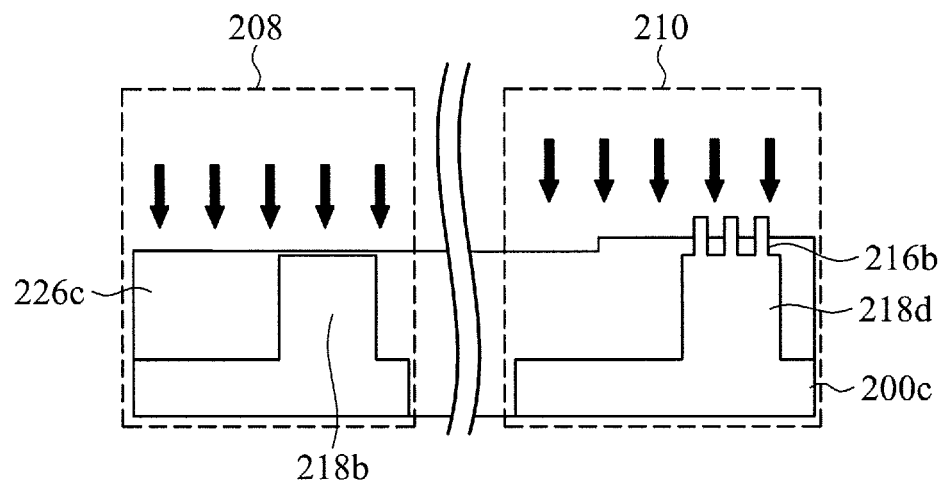
Figure 5M:
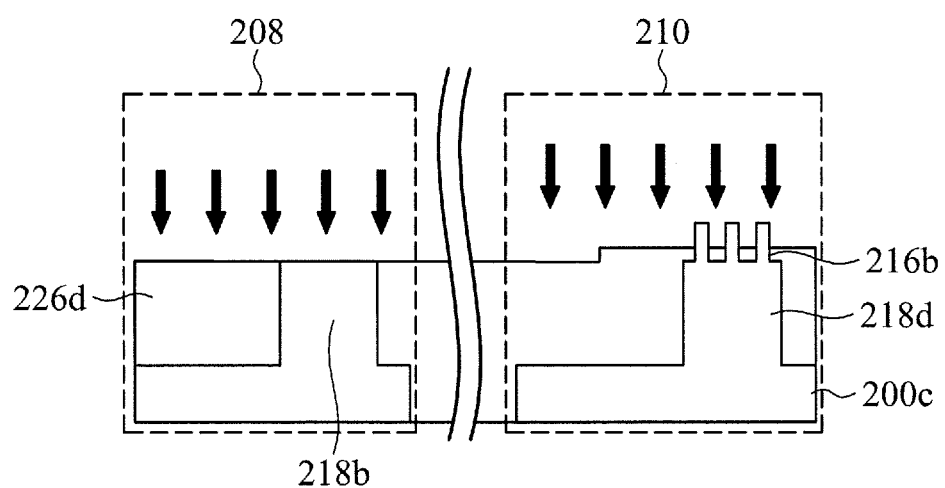
Figure 5N:
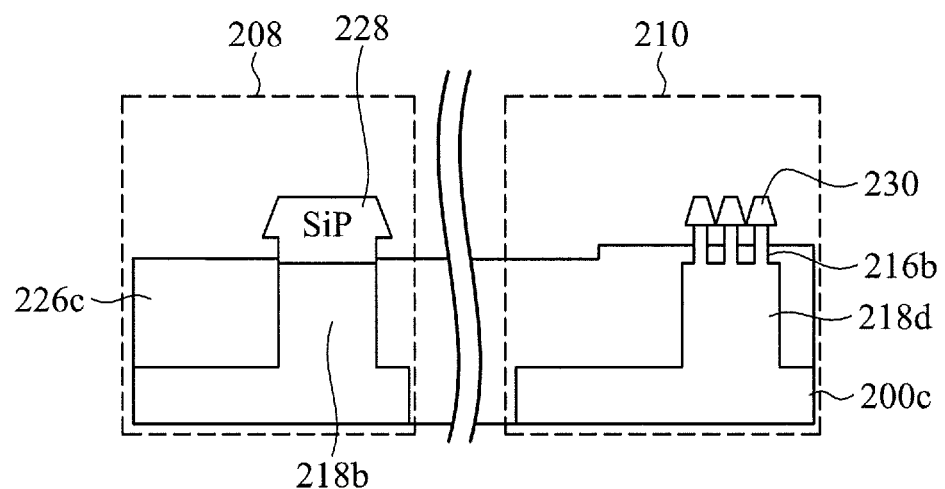

FIGS. 5A to 5N illustrate a method of making a device structure having both a non-planar (FinFET) OD area and a planar (FinFET) OD area. It should be understood that the non-planar (FinFET) OD area and planar (FinFET) OD area may be adjacent to one another or spaced from one another, and the figures are provided merely for purposes of illustrating steps that may be used in accordance with certain embodiments for making those areas without trying to illustrate their respective positions with respect to one another.

Starting with FIG. 5A, a silicon substrate 200 is provided with a layer of oxide 202, which is referred to as a pad oxide, formed thereover, in accordance with some embodiments. A layer of silicon nitride (SiN) 204, referred to as the OD SiN, is formed over layer 202. And a layer oxide 206, referred to as the OD oxide, is formed over layer 204. Thus far, region 208 (which will correspond to the planer (FinFET) OD area) and region 210 (which will correspond to the non-planar (FinFET) OD area) are identical. A mask layer 212, composed of vertical pillars or fingers spaced apart from one another, is formed over layer 206 in the non-planar OD area 210 and not in the planar OD area 208.

In FIG. 5B, a protective layer 214, which may be a layer of photoresist, is formed over the structure of FIG. 5A and openings 215a and 215b are etched or otherwise formed through layer 214 down to layer 206, i.e., exposing portions of upper boundary of layer 206. In some embodiments, this etch step results in removal of some of the pillars of mask layer 212. In some embodiments, the etch step to form the openings 215a and 215b may include performing at least one dry etching process (e.g., a reactive ion etching (RIE) process) on a blank photoresist layer.

In FIG. 5C, the protective layer 214 is removed, leaving modified mask layer 212a. In some embodiments, the step to remove the protective layer 214 may include performing a selective wet etching process, which removes protective layer 214 only and leaves modified mask layer 212a substantially intact.

In FIG. 5D, the modified mask layer 212a is used as a mask to etch through the layers 202, 204 and 206 (FIG. 5C) and partially into silicon substrate 200. In embodiments, this etch step etches a distance E of about 50 nm into the silicon substrate 200 leaving modified silicon substrate 200a having silicon pillars or fingers 216 that correspond to the fins 16 of FIG. 1, with remaining partial layers 202a, 204a and 206a thereover. In some embodiments, the etch step to form the fingers 216 may include performing one or more dry etching processes (e.g., a reactive ion etching (RIE) process) on layers 206, 204, 202, and 200, respectively or collectively.

In FIG. 5E, after removal of layer 206a, another protective layer 222 is formed and the silicon substrate 200a (FIG. 5D) is etched to create modified silicon substrate 200b with opening 220a in planar OD (FinFET) area 208, opening 220b in non-planar (FinFET) OD area 210 between OD area 208 and OD area 210. These openings will be used to form oxide regions 14 in FIG. 1. This step leaves four silicon platforms 218a, 218b, 218c and 218d in modified silicon substrate 200b.

In FIG. 5F, another protective layer 224, which may be a photoresist layer, is formed over the structure and openings are formed to etch through the modified silicon substrate 200b to remove platforms 218a and 218c, leaving silicon platform 218b and 218d in silicon substrate 200c. In some embodiments, such a step to remove silicon platforms 218a an 218c may be optional. Silicon platform 218d has silicon pillars 216b formed thereover with remaining portions of layers 202b and 204b formed over the pillars 216b.

In FIG. 5G, the protective layer 224 is removed, leaving modified silicon substrate 200c with platforms 218b and 218d, with silicon pillars 216b and remaining layers 202b and 204b formed over platform 218d. In some embodiments, the step to remove the protective layer 224 may include performing a selective wet etching process, which removes the protective layer 224 only and leaves platforms 218b and 218d (and corresponding structures formed thereover) substantially intact.

In FIG. 5H, an oxide layer 226 is deposited over the structure of FIG. 5G for use in forming shallow trench isolation regions.

In FIG. 5I, a chemical mechanical polish (CMP) operation is performed on the shallow trench isolation oxide layer 226, leaving polished oxide layer 226a. As shown in FIG. 5I, the polished oxide layer 226a has a step, with the upper surface of the oxide region over silicon platform 218b being about 50 nm higher than the upper surface of the oxide region over silicon platform 218b, which corresponds to the height E of the silicon pillars 216b. This CMP operation exposes the SiN layer 204b and oxide layer 202b disposed over silicon pillars 216b.

In FIG. 5J, an etching operation is performed that removes the SiN layer 204b and further reduces the height of the oxide layer, leaving oxide layer 226b.

In FIG. 5K, the pad oxide layer 202b over the silicon pillars 216b is removed using an etch process with etch selectivity to avoid damage to the silicon substrate.

In FIG. 5L, a directional etch process (illustrated by the use of arrows in the figure) is used to reduce the oxide height further, leaving reduced height oxide layer 226c. This process increases the height that the silicon pillars 216b extend above the oxide layer 226c. A small amount of oxide still remains over the silicon platform 218b.

In FIG. 5M, a final directional etch process (again illustrated by use of arrows in the figure) is performed before the source/drain growth process. This etch process is used to further reduce the oxide height, leaving further reduced height oxide layer 226d. This process further increases the height that the silicon pillars 216b extend above the oxide layer 226d. This etch process also exposes the silicon platform 218b, removing the oxide thereover. There is some loading effect, which results in the height of silicon platform 218b being slightly less than the height of platform 218d (e.g., by about 5.65 nm).

In FIG. 5N, epitaxial structure 228, which corresponds to source/drain region 24 in FIG. 1, is formed over the silicon platform 218b. Also, epitaxial structures 230, which corresponds to source/drain regions 22 in FIG. 1, is formed over silicon platform 218d.

Following FIG. 5N, steps are performed to complete the structure of FIG. 1, including formation of the gate structures 26. In some other embodiments, the gate structures 26 may be formed prior to the formation of source/drain regions 228 and 230. These techniques are familiar to those of skill in the art of forming FinFET structures and are not repeated herein so as to avoid unnecessarily obscuring the present disclosure.

It should be understood that FIGS. 5A to 5N illustrate only one possible embodiment where fins are patterned. It should be understood that the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 6:
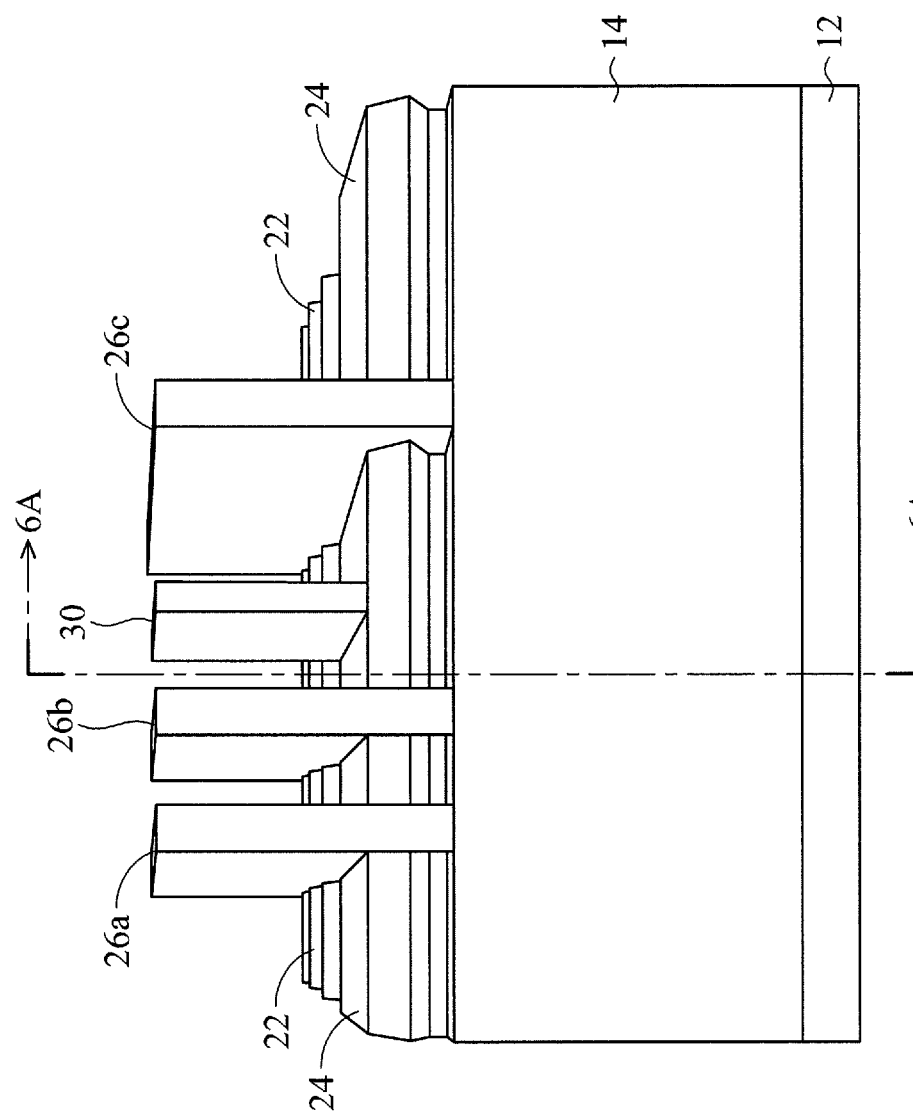
FIGS. 6 and 6A illustrate a contact connecting to the epitaxial layer of the semiconductor device structure of FIG. 1.
Figure 6A:
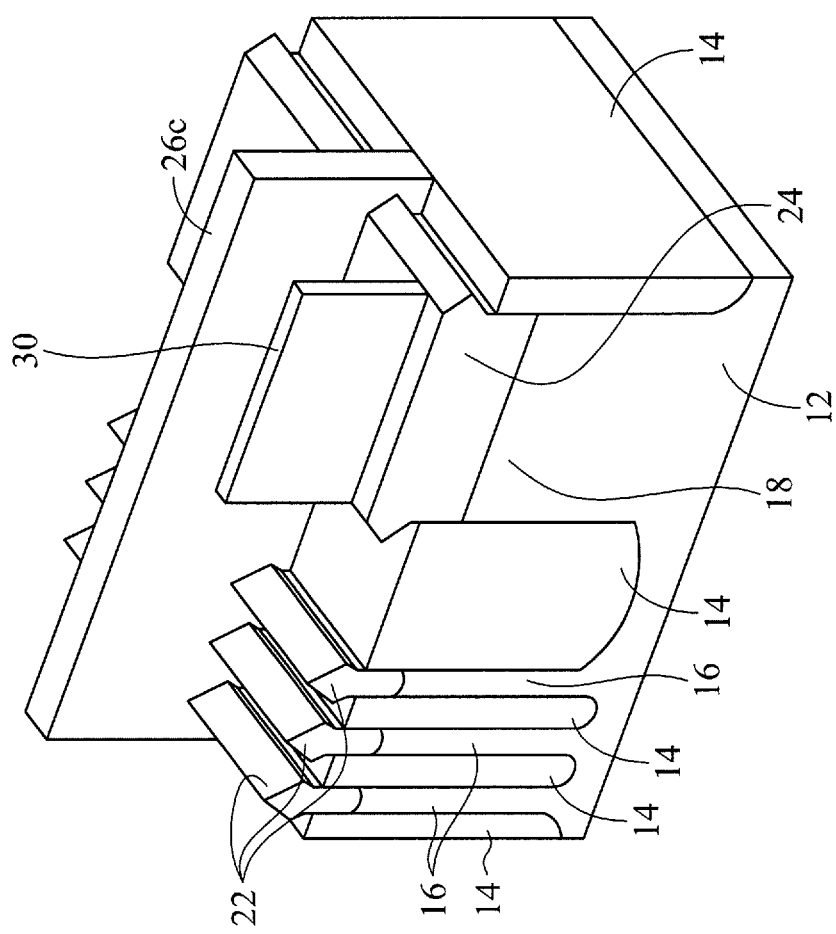

FIGS. 6 and 6A illustrate a contact 30, for example, a tungsten (W) contact, connecting to the epitaxial layer of the semiconductor device structure of FIG. 1. As can be seen in the figures, the substantially planar fin 18 provides a wide base that allows for improved epitaxial film growth, resulting in a substantially planar source/drain region 24 that provides an improved metal landing window for contact 30. In some embodiments, such a contact may be formed to extend through a dielectric layer 32 (typically known as an inter-layer dielectric or inter-metal dielectric layer) that overlays source/drain regions 22 and 24 and gate structures 26a to 26c. In some embodiments, such a dielectric layer 32 may include a low-k dielectric material.

In embodiments, a semiconductor device is provided that does not maintain the conventional FinFET structure or patterning across all active regions. This allows for the formation of area(s) where the FinFET device(s) have a FinFET structure that can be optimized in specific regions for different electrical requirements, for example to provide transistor device structures optimized for ESD protection, high voltage MOS devices (HVMOS), gated diodes, or other structures. In these areas, silicon epitaxial growth film quality is improved in the OD region, which allows for improved device performance, particularly in Idlin performance due to reduced Rsd resistance. The landing window for MD contact landing is increased, which improves yield and reliability performance.

In an embodiment, a semiconductor device semiconductor device includes a first fin field effect transistor (FinFET) device, the first FinFET device including a plurality of fins formed in a substrate, an epitaxial layer of semiconductor material formed on the fins forming non-planar source/drain regions, and a first gate structure traversing across the plurality of fins. The semiconductor device includes a second FinFET device, the second FinFET device including a substantially planar fin formed in the substrate, an epitaxial layer of the semiconductor material formed on the substantially planar fin and forming substantially planar source/drain regions, and a second gate structure traversing across the substantially planar fin. In certain embodiments, the semiconductor device further includes a third gate structure traversing across the substantially planar fin and spaced from the second gate structure, and a contact, the contact landing on the epitaxial layer formed over the substantially planar fin between the second and third gate structures. In certain embodiments, the substantially planar fin has a width in a direction parallel to the second gate structure that is at least 100 nm. In certain embodiments, the epitaxial layer of semiconductor material is silicon phosphorous (SiP). In certain embodiments, the second gate structure is in line with the first gate structure. In certain embodiments, the semiconductor device further includes a third gate structure traversing over the substantially planar fin and spaced from the second gate structure, and a fourth gate structure traversing over the plurality of non-planar fins. In certain embodiments, the first FinFET device and second FinFET devices are formed in first and second active areas, respectively, that are separated by an oxide region. In certain embodiments, a part of the epitaxial layer of semiconductor material formed on the substantially planar fin of the second FinFET device extends over a part of the oxide region. In certain embodiments, an upper surface of the substantially planar fin is lower than an upper surface of the plurality of fins. In certain embodiments, the plurality of fins of the first FinFET device are spaced from one another a distance that is less than a width of the substantially planar fin of the second FinFET device.

In another embodiment, a method of forming a semiconductor device includes the steps of: providing a substrate, etching the substrate in a first area to form a plurality of fins of a first fin field effect transistor (FinFET); etching the substrate in a second area to form a substantially planar fin of a second FinFET transistor; forming an epitaxial layer of semiconductor material on the plurality of fins and on the substantially planar fin; forming a first gate structure across the plurality of non-planar fins; and forming a second gate structure across the planar fin. The epitaxial layer on the plurality of fins provides a plurality of non-planar source/drain regions adjacent to the first gate structure, and the epitaxial layer on the substantially planar fin provides substantially planar source/drain regions adjacent to the second gate structure. In certain embodiments, the method further includes the steps of forming a third gate structure in the second area across the substantially planar fin, wherein the third gate structure is spaced from the second gate structure, and forming a contact, the contact landing on the epitaxial layer formed over the substantially planar fin between the second and third gate structures. In certain embodiments, the substantially planar fin has a width in a direction parallel to the second gate structure that is at least 100 nm. In certain embodiments, the epitaxial layer of semiconductor material is silicon phosphorous (SiP). In certain embodiments, the second gate structure is in line with the first gate structure. In certain embodiments, the method further includes the step of etching an oxide separation region in the substrate between the first and second areas and filling the oxide separation region with an oxide. In certain embodiments, an upper surface of the substantially planar fin is lower than an upper surface of the plurality of fins.

In another embodiment, a semiconductor device includes a first active area having a first fin field effect transistor (FinFET) device formed therein, the first FinFET device including a plurality of fins formed in a substrate, an epitaxial layer of semiconductor material formed on the fins forming non-planar source/drain regions, and a first gate structure traversing across the plurality of fins. The device also includes a second active area having a second FinFET device formed therein, the second FinFET device including a substantially planar fin formed in the substrate, an epitaxial layer of the semiconductor material formed on the substantially planar fin and forming substantially planar source/drain regions, and a second gate structure traversing across the substantially planar fin. The semiconductor device includes a contact, the contact landing on the epitaxial layer formed over the substantially planar fin. The epitaxial layer of semiconductor material is silicon phosphorous (SiP), and the substantially planar fin has a width in a direction parallel to the second gate structure that is at least 100 nm. In certain embodiments, the semiconductor device further includes a third gate structure traversing across the substantially planar fin and spaced from the second gate structure, wherein the contact is disposed between the second and third gate structures. In certain embodiments, the second gate structure is in line with the first gate structure.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first fin field effect transistor (FinFET) device, the first FinFET device comprising a plurality of non-planar fins extending from a substrate, an epitaxial layer formed on the plurality of non-planar fins forming first source/drain regions, a first gate structure and a second gate structure, wherein the first gate structure and the second gate structure are configured to traverse across the plurality of non-planar fins; and
   a second FinFET device, the second FinFET device comprising a planar fin extending from the substrate, wherein the epitaxial layer is formed on the planar fin to form second source/drain regions, and a third gate structure, wherein the third gate structure is configured to traverse across the planar fin,
   wherein a first spacing between the first gate structure and the second gate structure is less than a second spacing between the second gate structure and the third gate structure.

2. The semiconductor device of claim 1, further comprising:
   a contact, wherein the contact is formed on the epitaxial layer formed over the planar fin between the fourth gate structure and the third gate structure.

3. The semiconductor device of claim 1, wherein the planar fin has a first width in a direction parallel to the first gate structure, wherein the first width is greater than 100 nanometers, and wherein each of the plurality of non-planar fins has a second width in a direction parallel to the third gate structure, wherein the first width is greater than the second width.

4. The semiconductor device of claim 1, wherein the epitaxial layer comprises at least one of the following: silicon phosphorous (SiP) and silicon germanium (SiGe).

5. The semiconductor device of claim 1, wherein the second gate structure is in line with the third gate structure.

6. The semiconductor device of claim 1, wherein the first gate structure is configured to traverse over the planar fin and spaced from the third gate structure and the fourth gate structure; and wherein the fourth gate structure is configured to traverse over the plurality of non-planar fins and spaced from the first gate structure and the second gate structure.

7. The semiconductor device of claim 1, wherein the first FinFET device and second FinFET devices are formed in first and second active areas, respectively, that are separated by an oxide region.

8. The semiconductor device of claim 7, wherein a part of the epitaxial layer formed on the planar fin of the second FinFET device extends over a part of the oxide region.

9. The semiconductor device of claim 7, wherein an upper surface of the planar fin is lower than an upper surface of the plurality of non-planar fins.

10. The semiconductor device of claim 1, wherein the plurality of non-planar fins of the first FinFET device are spaced from one another a distance that is less than a width of the planar fin of the second FinFET device.

11. A semiconductor device comprising:
    a first active area having a first fin field effect transistor (FinFET) device formed therein, the first FinFET device comprising a plurality of non-planar fins formed in a substrate, an epitaxial layer formed on the plurality of non-planar fins forming first source/drain regions, a first gate structure and a second gate structure, wherein the first gate structure and the second gate structure are configured to traverse across the plurality of non-planar fins;
    a second active area having a second FinFET device formed therein, the second FinFET device comprising a planar fin formed in the substrate, wherein the epitaxial layer is formed on the planar fin to form second source/drain regions, and a third gate structure, wherein the third gate structure is configured to traverse across the planar fin, wherein a first spacing between the first gate structure and the second gate structure is less than a second spacing between the second gate structure and the third gate structure; and
    a contact, the contact is formed on the epitaxial layer formed over the planar fin between the second gate structure and the third gate structure, wherein the epitaxial layer is silicon phosphorous (SiP).

12. The semiconductor device of claim 11, wherein the first gate structure is configured to traverse over the planar fin and spaced from the third gate structure and the fourth gate structure; and wherein the fourth gate structure is configured to traverse over the plurality of non-planar fins and spaced from the first gate structure and the second gate structure.

13. The semiconductor device of claim 11, wherein the planar fin has a first width in a direction parallel to the first gate structure, wherein the first width is greater than 100 nanometers, and wherein each of the plurality of non-planar fins has a second width in a direction parallel to the third gate structure, wherein the first width is greater than the second width.

14. A semiconductor device comprising:
    a first fin field effect transistor (FinFET) device, the first FinFET device comprising a plurality of non-planar fins extending from a substrate, an epitaxial layer formed on the plurality of non-planar fins forming first source/drain regions, a first gate structure and a second gate structure, wherein the first gate structure and the second gate structure are configured to traverse across the plurality of non-planar fins; and
    a second FinFET device, the second FinFET device comprising a planar fin extending from the substrate, wherein the a first epitaxial layer is formed on the planar fin to form second source/drain regions, and a third gate structure, wherein the third gate structure is configured to traverse across the planar fin,
    wherein a first bottom surface of an epitaxial layer formed on the planar fin of the second FinFET device is lower than a second bottom surface of an epitaxial layer formed on the plurality of non-planar finds of the first FinFET device,
    wherein the planar fin has a first width in a direction parallel to the first gate structure, and wherein each of the plurality of non-planar fins has a second width in a direction parallel to the third gate structure, wherein the first width is greater than the second width.

15. The semiconductor device of claim 14, further comprising:
   a contact, wherein the contact is formed on the epitaxial layer formed over the planar fin between the fourth gate structure and the third gate structure.

16. The semiconductor device of claim 14, further comprising a shallow trench isolation region having a step increase in height.

17. The semiconductor device of claim 14, wherein the second gate structure is in line with the third gate structure.

18. The semiconductor device of claim 14, wherein the first gate structure is configured to traverse over the-planar fin and spaced from the third gate structure and the fourth gate structure; and wherein fourth gate structure is configured to traverse over the plurality of non-planar fins and spaced from the first gate structure and the second gate structure.

19. The semiconductor device of claim 14, wherein a part of the epitaxial layer formed on the planar fin of the second FinFET device extends over a part of a oxide region.

* * * * *